(12) United States Patent
Voo

(10) Patent No.: US 7,586,372 B1
(45) Date of Patent: Sep. 8, 2009

(54) PROGRAMMABLE GAIN-FREQUENCY PROFILE AMPLIFIER

(75) Inventor: Thart Fah Voo, Singapore (SG)

(73) Assignee: Marvell International Ltd., Hamilton (BM)

( * ) Notice: Subject to any disclaimer, the term of this patent is extended or adjusted under 35 U.S.C. 154(b) by 92 days.

(21) Appl. No.: 11/755,566

(22) Filed: May 30, 2007

Related U.S. Application Data

(60) Provisional application No. 60/830,629, filed on Jul. 13, 2006, provisional application No. 60/831,759, filed on Jul. 19, 2006.

(51) Int. Cl.
*H03F 3/45* (2006.01)
(52) U.S. Cl. .......................................... 330/254; 330/51
(58) Field of Classification Search .................. 330/51, 330/253, 254, 278
See application file for complete search history.

(56) References Cited

U.S. PATENT DOCUMENTS 6,331,803 B1 12/2001 Zheng et al.
6,552,612 B1 * 4/2003 Wilson ....................... 330/254
7,250,814 B2 * 7/2007 Bardsley et al. ............... 330/51
7,292,101 B2 * 11/2007 Kocaman et al. ............ 330/254

* cited by examiner

*Primary Examiner*—Khanh V Nguyen

(57) ABSTRACT

A programmable gain-frequency profile amplifier is disclosed that includes a first gain amplifier amplifying an electrical signal based on a first gain-frequency profile, and one or more second gain circuits that may be programmable to substantially modify a portion of the first gain-frequency profile without appreciably modifying another portion of the first gain-frequency profile. One or more programming circuits may be connected to the second gain circuits and controlled by one or more control data inputs to turn on and off one or more of the second gain circuits. One or more capacitive coupling networks may be provided to couple the second gain circuits to the electrical signal. Each of the second gain circuits in combination with a corresponding capacitive coupling network amplifies the electrical signal based on a second gain-frequency profile which may be combined with the first gain-frequency profile of the first gain circuit to generate a composite gain-frequency profile for the programmable amplifier.

42 Claims, 11 Drawing Sheets

PROGRAMMABLE GAIN-FREQUENCY PROFILE AMPLIFIER

INCORPORATION BY REFERENCE

This application claims priority under 35 U.S.C. §119(e) from U.S. Provisional Application Ser. No. 60/830,629 filed on Jul. 13, 2006 and U.S. Provisional Application Ser. No. 60/931,759 filed on Jul. 19, 2006, both incorporated by reference herein in their entirety.

BACKGROUND

The present disclosure relates to a programmable amplifier, and more particularly to a programmable amplifier capable of programmably changing a gain-frequency profile such as boosting high-frequency signals relative to low-frequency signals.

Analog amplifiers are incorporated into a vast number of devices used in everyday life. For example, analog amplifiers are used in automobile engines, cellular telephones, magnetic hard disk drives, fiber optic communication systems and even children's toys.

Unfortunately, analog amplifiers often suffer from such performance shortfalls as limited dynamic range and distortion in the presence of heavy output loads. Further, analog amplifiers are subject to a trade-off between available voltage gain and frequency bandwidth. This trade-off, often referred to as the amplifier's "gain-bandwidth product," may remain nearly constant over the operating range of the amplifier. Thus, an increase in gain may decrease the bandwidth of the amplifier, while an increase in bandwidth may require a decrease in gain. As a result, for a given fixed gain, important high-frequency signal components of an amplified signal may be attenuated relative to low-frequency components. Transducers and electronic transmission equipment coupled to the input of an amplifier may also vary substantially in both their sensitivity and bandwidth, both due to manufacturing process variations and as a response to environmental circumstances. Accordingly, it should be appreciated that, either due to the internal or external factors discussed above, a particular analog amplifier may produce an output signal with its high-frequency components excessively attenuated to the detriment of the system incorporating the amplifier.

SUMMARY OF THE DISCLOSURE

A programmable gain-frequency profile amplifier is disclosed that includes a first gain circuit coupled to a load circuit to amplify the electrical signal based on a first gain-frequency profile. The programmable amplifier may also include one or more second gain circuits that are connected in parallel with one another and with the first gain circuit. Each second gain circuit may be programmable to substantially modify a portion of the first gain-frequency profile that is less than the first gain-frequency profile without appreciably modifying another portion of the first gain-frequency profile. The first gain circuit may include a first pair of transistors connected as a first differential pair and connected to a first current source, and each of the second gain circuits may include a second pair of transistors connected as a second differential pair and connected to a second current source.

One or more programming circuits may be connected to at least one of the second gain circuits and controlled by one or more control data inputs to turn on and off one or more of the second gain circuits. One or more capacitive coupling networks may be provided to couple the second gain circuits to the electrical signal. The capacitive networks may include one or more capacitors and one or more resistors that perform filtering. Each of the second gain circuits in combination with a corresponding capacitive coupling network amplifies the electrical signal based on a second gain-frequency profile. The second gain-frequency profiles may be combined with the first gain-frequency profile of the first gain circuit to generate a composite gain-frequency profile for the programmable amplifier. The composite gain-frequency profile may be changed by the control data via the programming circuits.

DETAILED DESCRIPTION OF EMBODIMENTS

In the following descriptions, many of the exemplary circuits are shown to include n-channel metal-oxide-semiconductor field-effect transistors (MOSFETs) in a variety of configurations. While MOSFET devices are used by example, the disclosed circuits may be implemented using any number of other transistor types, such as J-FETs, bipolar transistors and so on. Additionally, while n-channel devices are used in the following examples, the same general approaches may also apply to circuits incorporating p-channel FETs or PNP bipolar transistors, for example.

Still further, while the terms "drain" and "source" are used for ease of explanation and to adhere to traditional engineering usage, it should be recognized that a drain and source of a FET transistor may be considered interchangeable, and for the following descriptions the drain and source merely thought of as a first end and a second end of a semiconductor channel unless otherwise stated or apparent to one of ordinary skill in the art.

Figure 1:
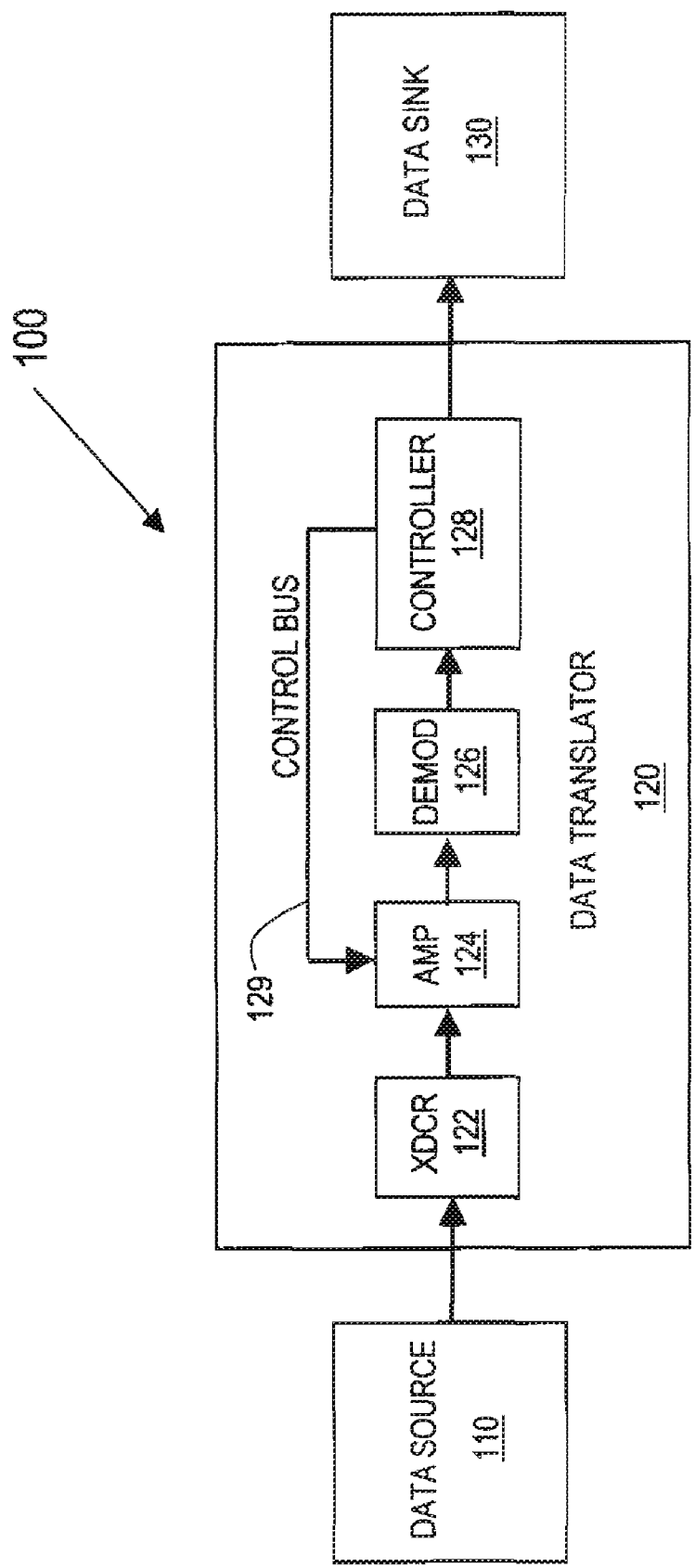
FIG. 1 is a block diagram of an exemplary data manipulation system that includes a programmable amplifier.

FIG. 1 is a block diagram of an exemplary data manipulation system 100. As shown in FIG. 1, the data manipulation system 100 includes a data source 110, a data translator 120 and a data sink 130. As is also shown in FIG. 1, data translator 120 includes a transducer 122, a programmable amplifier 124, a demodulator 126 and a controller 128.

In operation, a data signal may be provided by data source 110 to the data translator's transducer 122. Transducer 122, in turn, may change the data signal from a first form, e.g., a magnetic field or modulated light signal, to an output signal having an electrical form. The output electrical signal may then be fed to programmable amplifier 124. Programmable amplifier 124 may receive the electrical signal produced by transducer 122, amplify the electrical signal while optionally enhancing high-frequency components of the electrical signal, and provide the resultant amplified/enhanced electrical signal to demodulator 126.

Upon receiving the amplified/enhanced electrical signal, demodulator 126 may perform any number of processes to convert the amplified/enhanced signal from analog form to a stream of digital data, which then may be forwarded to controller 128.

As controller 128 receives the stream of digital data from demodulator 126, controller 128 may both forward the digital data to the data sink 130 and perform any number of analyses on the digital data. For example, controller 128 may look for characteristic errors that may indicate that demodulator 126 is receiving signals that have undergone excess distortion due to bandwidth limitations of transducer 122, amplifier 124 or some other device. Alternatively, demodulator 126 may perform analysis on the amplified/enhanced electrical signal provided by programmable amplifier 124 and forward the analysis results to controller 128.

After an appropriate analysis is performed, controller 128 may send any number of control signals to programmable amplifier 124 via control bus 129. The various control signals sent via control bus 129 may include control information instructing the programmable amplifier 124 to change its gain level. Additionally, the control signals sent via control bus 129 may include control information instructing programmable amplifier 124 to change a gain-frequency profile in order to enable programmable amplifier 124 to enhance or de-emphasize high-frequency components of the programmable amplifier's output signal relative to low-frequency components.

Upon receiving the control signals, programmable amplifier 124 may make the appropriate internal changes to adjust its gain and/or gain-frequency profile. Subsequently, the adjusted amplified output signal may be fed to demodulator 126 and controller 128 for further demodulation and analysis.

In various embodiments, data source 110 may be any number of known or later developed data communication systems or data storage systems. For example, data source 110 may be a fiber-optic communication system, a wireless transmitter, an electrical transmission system (e.g., an Ethernet LAN), an optical storage medium, a magnetic hard disk drive, an electronic memory and so on. Similarly, data sink 130 may be any number of known or later developed data communications or storage systems capable of receiving signals produced by data translator 120.

Depending on the nature of data source 110, transducer 122 may be any number of known or later developed transducer systems, such as a magnetic head reader for a hard disk drive, an optical-to-electrical transducer, a transimpedance amplifier, a voltage buffer, an antenna for use with a wireless communication system and the like.

Given the wide variety of environmental circumstances that translator 120 may endure, as well as the manufacturing process variations that may occur in data source 110 or transducer 122, the gain and/or gain-frequency profile of programmable amplifier 124 may need to be adjusted as will be further discussed below.

Figure 2:
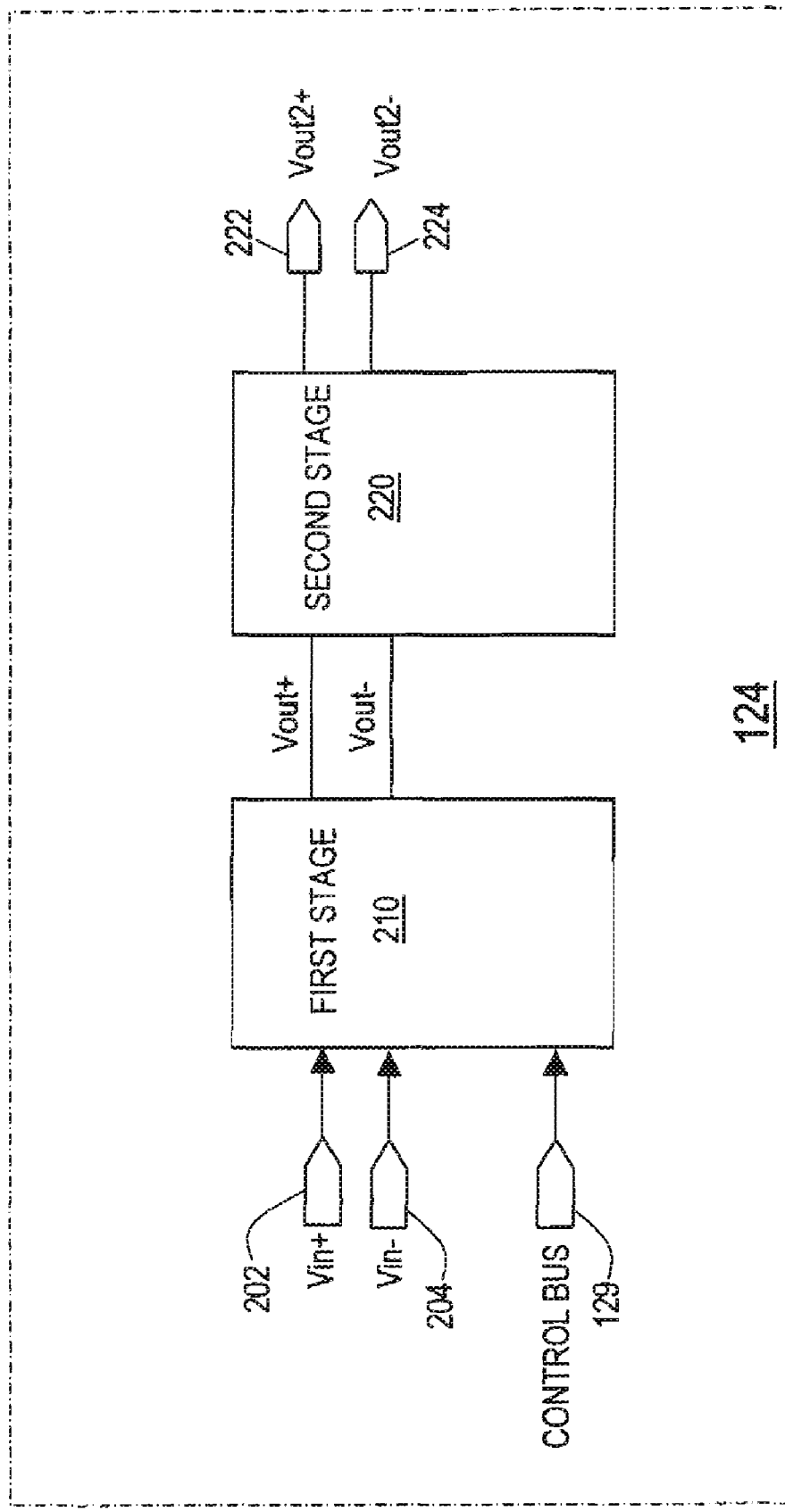
FIG. 2 is a block diagram of a portion of an exemplary amplifier that may be used in the data manipulation system of FIG. 1.

FIG. 2 depicts a portion of the programmable amplifier 124 of FIG. 1. As shown in FIG. 2, programmable amplifier 124 includes a first amplifier stage 210 and an optional second amplifier stage 220. In operation, first amplifier stage 210 may receive any number of commands from control bus 129. Based on the commands provided by control bus 129, first amplifier stage 210 may configure (or reconfigure) its internal circuitry to provide a variety of gain levels, as well as manipulate various internal filtering circuitry as will be further discussed below.

Assuming that programmable amplifier 124 is under power and that first amplifier stage 210 is appropriately configured, a differential electrical signal (Vin+, Vin−) (which may be a single-ended electrical signal with ground) may be provided by a pair of input nodes 102 and 104 to first amplifier stage 210. First amplifier stage 210 may then amplify the received electrical signal, as well as modify certain high-frequency spectral components of the received signal that might be necessary or helpful due to distortion of the received electrical signal, distortion inadvertently caused by gain-bandwidth limitations of first amplifier stage 210 or some other cause.

After amplifying and/or spectrally modifying the received electrical signal, first amplifier stage 210 may output the amplified/modified signal to (optional) second amplifier stage 220, which may further amplify the electrical signal and output the further amplified signal (Vout2+, Vout2−) to output nodes 122 and 124.

Figure 3:
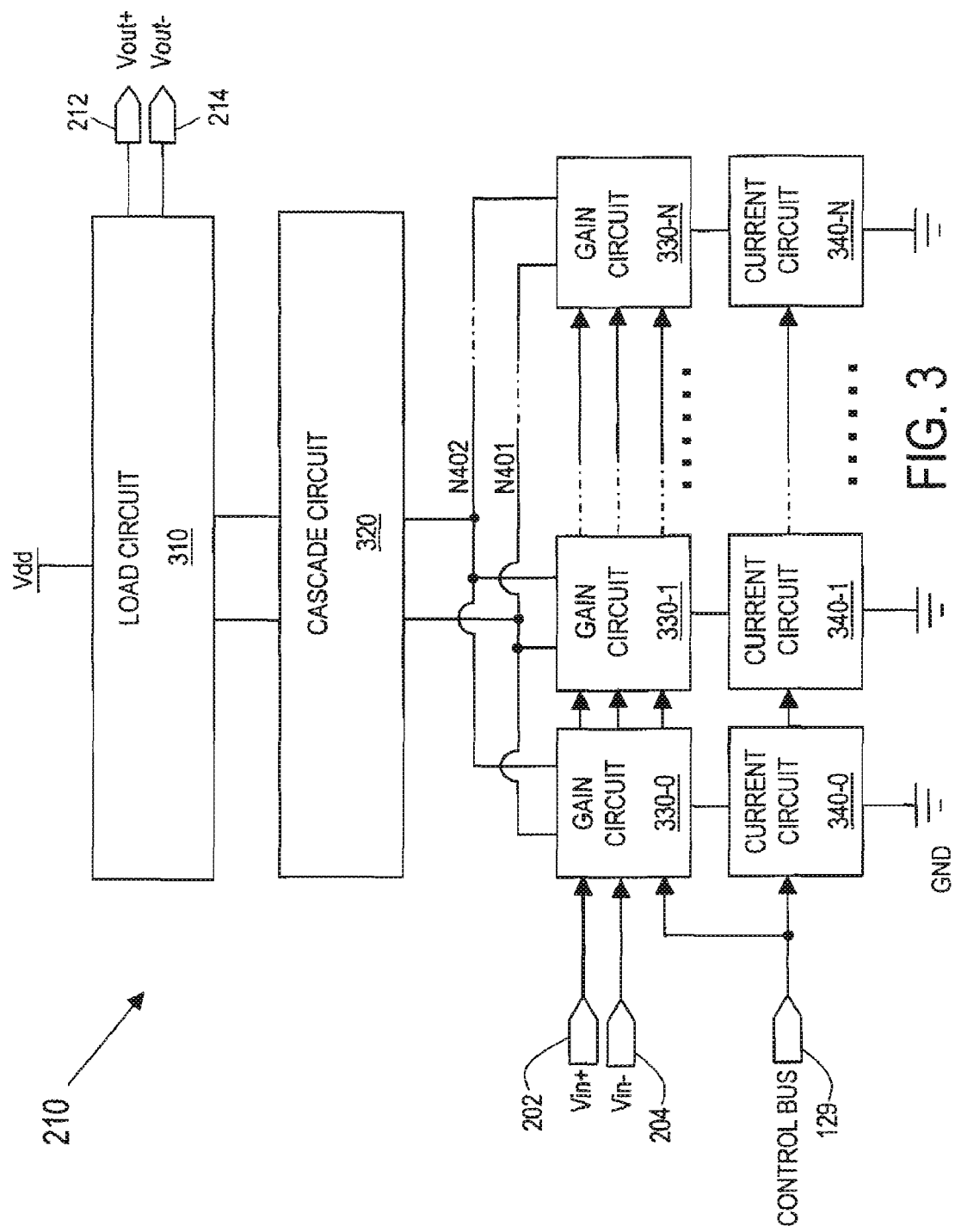
FIG. 3 is a block diagram of an exemplary amplifying stage of the amplifier of FIG. 2.

FIG. 3 is a block diagram of the first amplifier stage 120 of FIG. 2. As shown in FIG. 3, the first amplifier stage 120 includes a load circuit 310, a cascade circuit 320, a number of gain circuits 330-0 . . . 330-N and a number of current circuits 340-0 . . . 340-N. First gain circuit 330-0 and first current circuit 340-0 will be discussed with respect to FIG. 4, the remaining gain circuits 330-1 . . . 330-N and current circuits 340-1 . . . 340-N will be discussed with respect to FIGS. 5-8, and load circuit 310 and cascade circuit 320 will be discussed with respect to FIG. 9.

Figure 4:
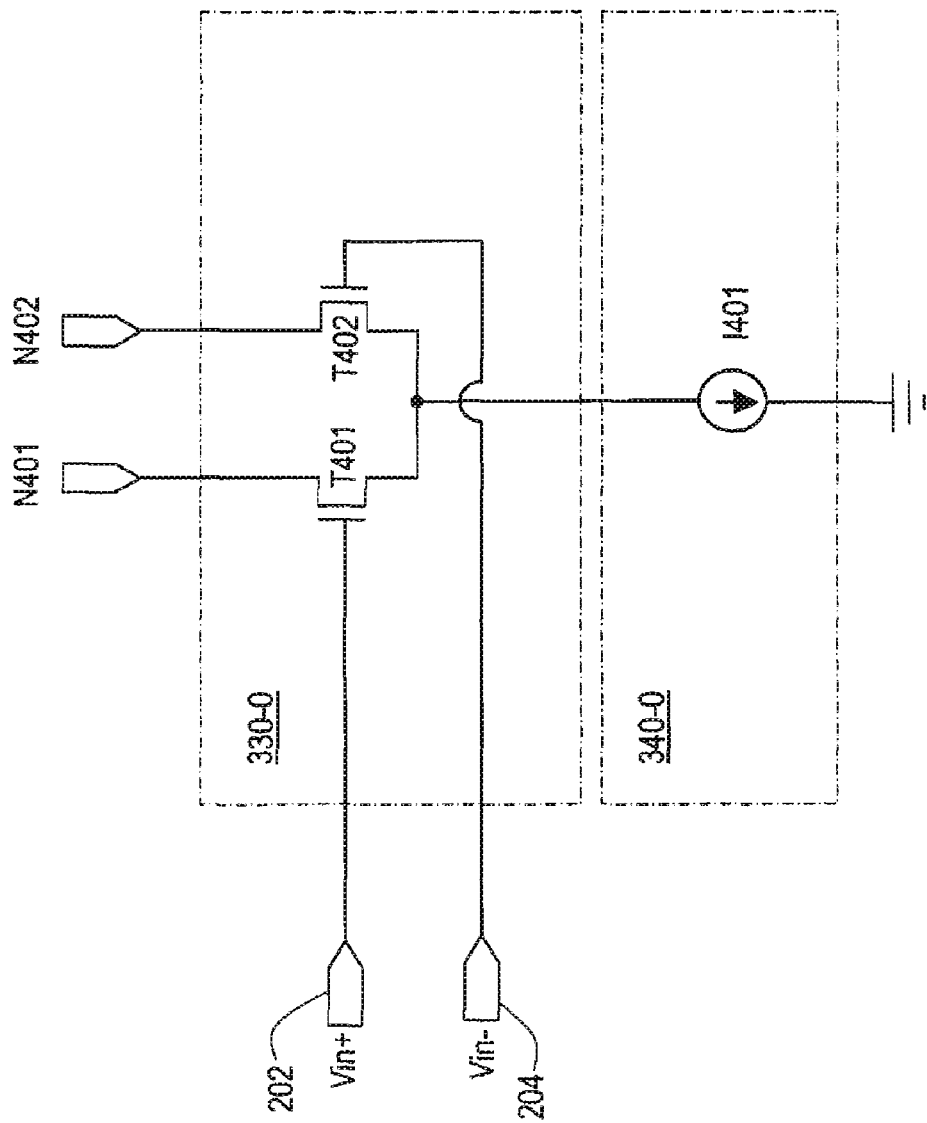
FIG. 4 is a schematic diagram of an exemplary first gain circuit and first current source for use in the amplifying stage of FIG. 3.

Continuing to FIG. 4, a schematic diagram of a first gain circuit 330 is depicted in context with a first current circuit 340-0. As shown in FIG. 4, gain circuit 330-0 includes a first transistor T401 and a second transistor T402, and first current circuit 340-0 includes a current source I401. Note that the sources of transistors T401 and T402 are connected directly to both one another and to the current source I401, the gates of transistors T401 and T402 are respectively connected to input nodes 102 and 104, and the drains of transistors T401 and T402 are respectively connected to nodes N401 and N402.

In operation, a differential electrical signal provided by nodes 102 and 104 may be used to drive the gates of transistors T401 and T402. In response, the respective channel conductances of transistors T401 and T402 may change in a manner to provide gain resulting in differential current signals applied to nodes N401 and N402. Note that the strength of the differential current signals may vary according to a number of parameters, such as the amplitude of the differential input signal, the intrinsic characteristics of the transistors T401 and T402, and the current level of the current source I401.

Note that while FIG. 4 depicts a single amplifying element, it should be appreciated that the gain circuit 330-0 and current source 340-0 of FIG. 4 may be replaced or supplemented with other circuitry capable of providing variable gain. For example, it may be possible to change the overall gain of gain circuit 330-0 by making current source 340-0 variable. Further, it may be possible to supplement gain circuit 330-0 and current source 340-0 using any number of switchable gain circuits that may be added in parallel and coupled to nodes N401 and N402. Further examples of switchable gain circuits may be found in U.S. Pat. No. 6,331,803 herein incorporated by reference in its entirety for all purposes, as well as in contemporaneously filed U.S. patent application Ser. No. 09/566,861 entitled "Programmable Gain Amplifier" by inventor Thart Vah VOO (Singapore) also herein incorporated by reference in its entirety for all purposes.

Also note that while current source I401 is depicted as an ideal constant current source, in various embodiments current source I401 may take a number of forms, such as a resistor, a current mirror or any other known or later developed circuits useful as a current source.

Figure 5:
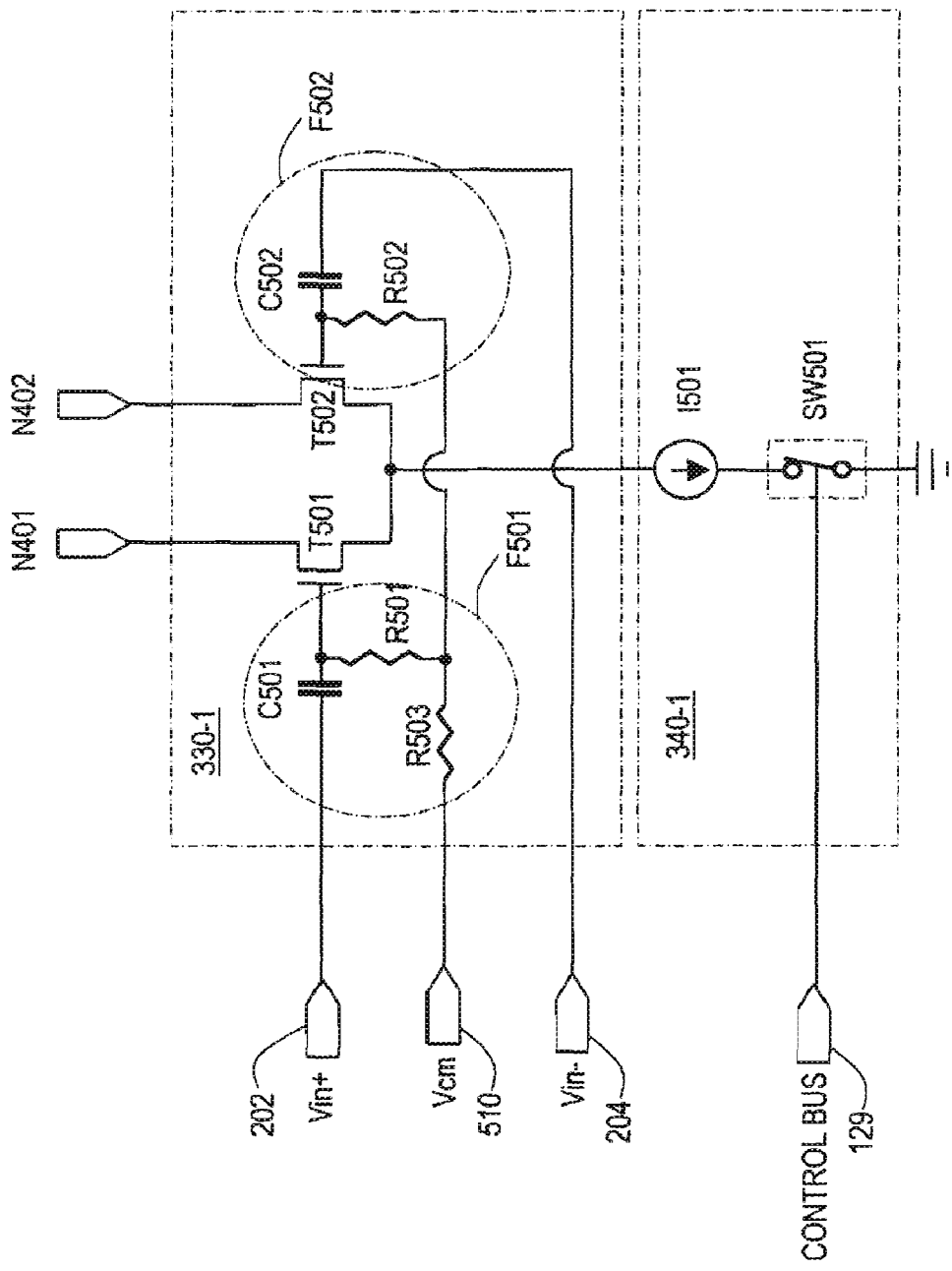
FIG. 5 is a schematic diagram of an exemplary high-frequency gain circuit and switchable current source for use in the first amplifying stage of FIG. 3.

Continuing to FIG. 5, a schematic diagram of an exemplary gain-frequency profile modifying gain circuit 330-1 is provided in context with a switchable current circuit 340-1. Gain-frequency profile modifying gain circuit 330-1 includes a pair of transistors T501 and T502, while switchable current circuit 340-1 includes a current source I501 in series with a current switch SW501.

Similar to gain circuit 330-0 of FIG. 4, the sources of transistors T501 and T502 are connected both to one another and to the current source I501 while the drains of transistors T501 and T502 are respectively connected to nodes N401 and N402.

However, unlike gain circuit 330-0 of FIG. 4, the respective gates of transistors T501 and T502 are not directly connected to input nodes 102 and 104, but are instead coupled to input nodes 102 and 104 via a pair of respective capacitive coupling circuits F501 and F502. As shown in FIG. 5, capacitive coupling circuit F501 includes capacitor C501 and resistor R501, and capacitive coupling circuit F502 includes capacitor C502 and resistor R502. Note that resistors R501 and R502 are commonly coupled together and to a third resistor R503, which may be in contact with a common mode voltage node 510 to assure that transistors T501 and T502 are properly gate-biased.

In operation, gain-frequency profile modifying gain circuit (gain circuit) 330-1 may be enabled or disabled based on the state of switch SW501. For example, should switch SW501 receive an "on" command from control bus 129, switch SW501 may close to enable current to pass from high-frequency gain circuit 330 to ground in a manner regulated by current source I501. The regulated current may enable gain circuit 330-1 to provide a differential current signal to nodes N401 and N402, which as discussed above in regard to FIG. 4 may be respectively connected to the drains of transistors T401 and T402.

Assuming that switch SW501 is in the closed/on position, a differential electrical signal presented at input nodes 102 and 104 may pass through the capacitive coupling circuits F501 and F502 and to the gates of transistors T501 and T502 to affect the conductance of their respective channels. In response, transistors T501 and T502 may provide gain resulting in an amplified differential current signal to nodes N401 and N402 noting that the low-frequency components of the differential current signal may be attenuated due to the capacitive coupling circuits F501 and F502, thus relatively enhancing the high-frequency signal components, for example.

While capacitive coupling circuits F501 and F502 are each depicted as a high-pass filter having a single frequency zero, capacitive coupling circuits F501 and F502 may also take the form of band-pass filters or otherwise incorporate any number of frequency poles and zeros as may be found necessary or advantageous.

In view of FIG. 5, it should be appreciated that the frequency zeros of capacitive coupling circuits F501 and F502 may be determined by the respective capacitive values of capacitors C501 and C502 and resistive values of resistors R501 and R502. It should also be appreciated that the frequency zeros of capacitive coupling circuits F501 and F502 may be strategically set by manipulating any of capacitors C501 and C502 and resistors R501 and R502).

While capacitors C501 and C502 and resistors R501-R503 are depicted as fixed components in FIG. 5, it further should be appreciated that capacitors C501 and C502 and resistors R501 and R502 may be made adjustable such that the respective frequency transfer functions of capacitive coupling circuit F501 and F502 may be made variable.

Still Further, it should be appreciated that the single gain circuit 330-1 and switchable current source 340-1 of FIG. 5 may be supplemented by adding a number of similar circuits configured in parallel with the circuitry of FIG. 5. For example, referring to FIG. 35 any or all of gain circuits 330-2 to 330-N and current circuits 340-2 to 340-N may share a configuration similar or identical to gain circuit 330-1 and current circuit 340-1. While in certain instances it may be useful for every gain circuit 330-1 . . . 330-N to have identical capacitive coupling circuits, in various embodiments it may also be useful to vary the frequency zeros of the capacitive coupling circuits from high-frequency gain circuit to high-frequency circuit to effectively create a frequency-agile gain-bandwidth filter.

Figure 6:
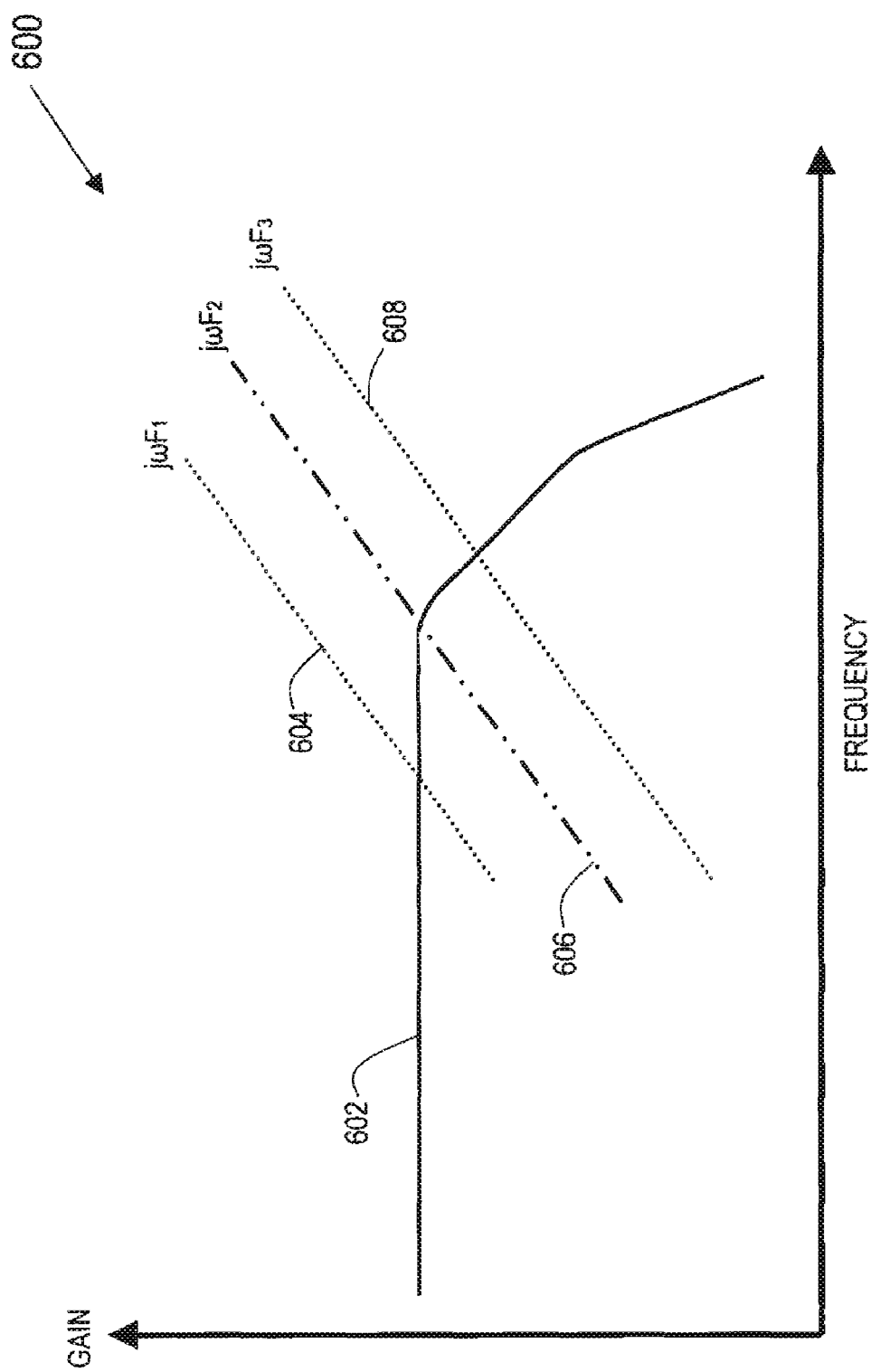
FIG. 6 is a Bode plot of an exemplary gain-frequency profile along with a number of frequency responses for a variety of ideal high-pass filters.

For example, in FIG. 6 a Bode plot of a gain-frequency profile 602 possibly attributable to the gain circuit 330-0 of FIG. 4 is depicted in context with three "idealized" transfer functions 604, 606 and 608 of three exemplary high-frequency gain circuits. The transfer functions 604, 606 and 608 are "idealized" in that they do not account for various parasitic frequency poles that may be found within first amplifier stage 210. Accordingly, as will be seen in the following discussions, any application of transfer functions 604, 606 and 608 to gain-frequency profile 602 may not result in a perfect linear combination. However, regardless of any parasitic elements within first amplifier stage 210, by adjusting gain-frequency profile 602 with any combination of transfer functions 604, 606 and 608, it may be possible to manipulate gain-frequency profile 602 to at least partially compensate for a limited gain-bandwidth product as well as for high-frequency signal attenuation of an input signal.

Figure 7:
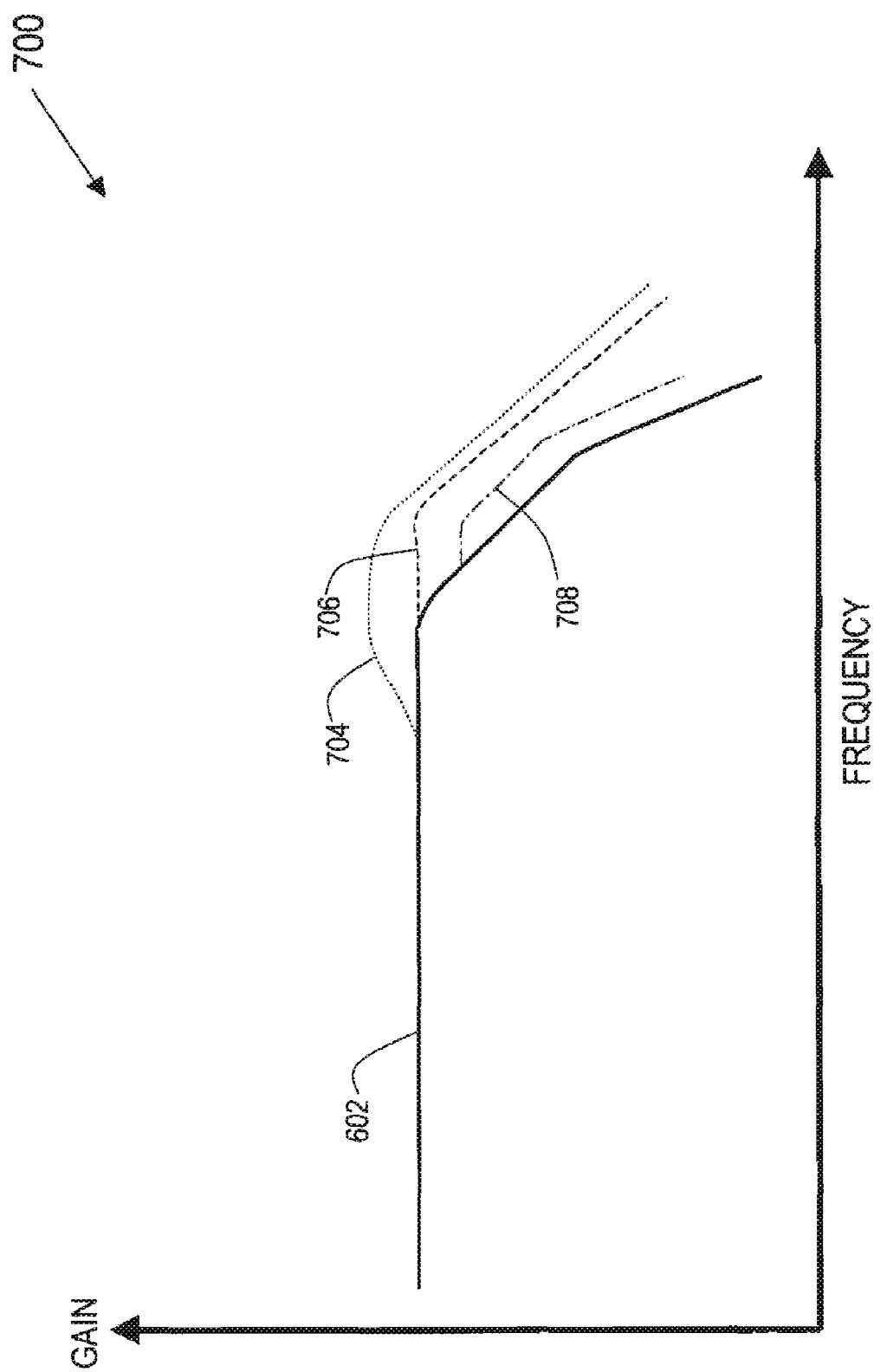
FIG. 7 depicts the Bode plot of the gain-frequency profile of FIG. 6 along with a number of modified versions of the gain-frequency profile.

For example, as shown in FIG. 7 the gain-frequency profile 602 of FIG. 6 is shown along with three possible "compensated" gain-frequency profile variations including gain-frequency profile 704, gain-frequency profile 706 and gain-frequency profile 708. In view of FIG. 7, it may be appreciated that by enabling an appropriate combination of gain circuits having various high-pass, band-pass or low-pass filters, it may be possible to strategically manipulate the first amplifier stage 210 of FIG. 3 to: (1) raise the gain level of the frequency components of gain-frequency profile 602 as is done in compensated gain-frequency profile 704, (2) effectively extend the "knee" of gain-frequency profile 602 as is done in compensated gain-frequency profile 706, and (3) slow or delay the attenuation of gain-frequency profile 602 to the right of its "knee" as is done in compensated gain-frequency profile 708. Thus, a portion of the gain-frequency profile 602 that is less than the complete gain-frequency profile 602 may be substantially modified without appreciably modifying other portions of the gain-frequency profile 602.

Figure 8:
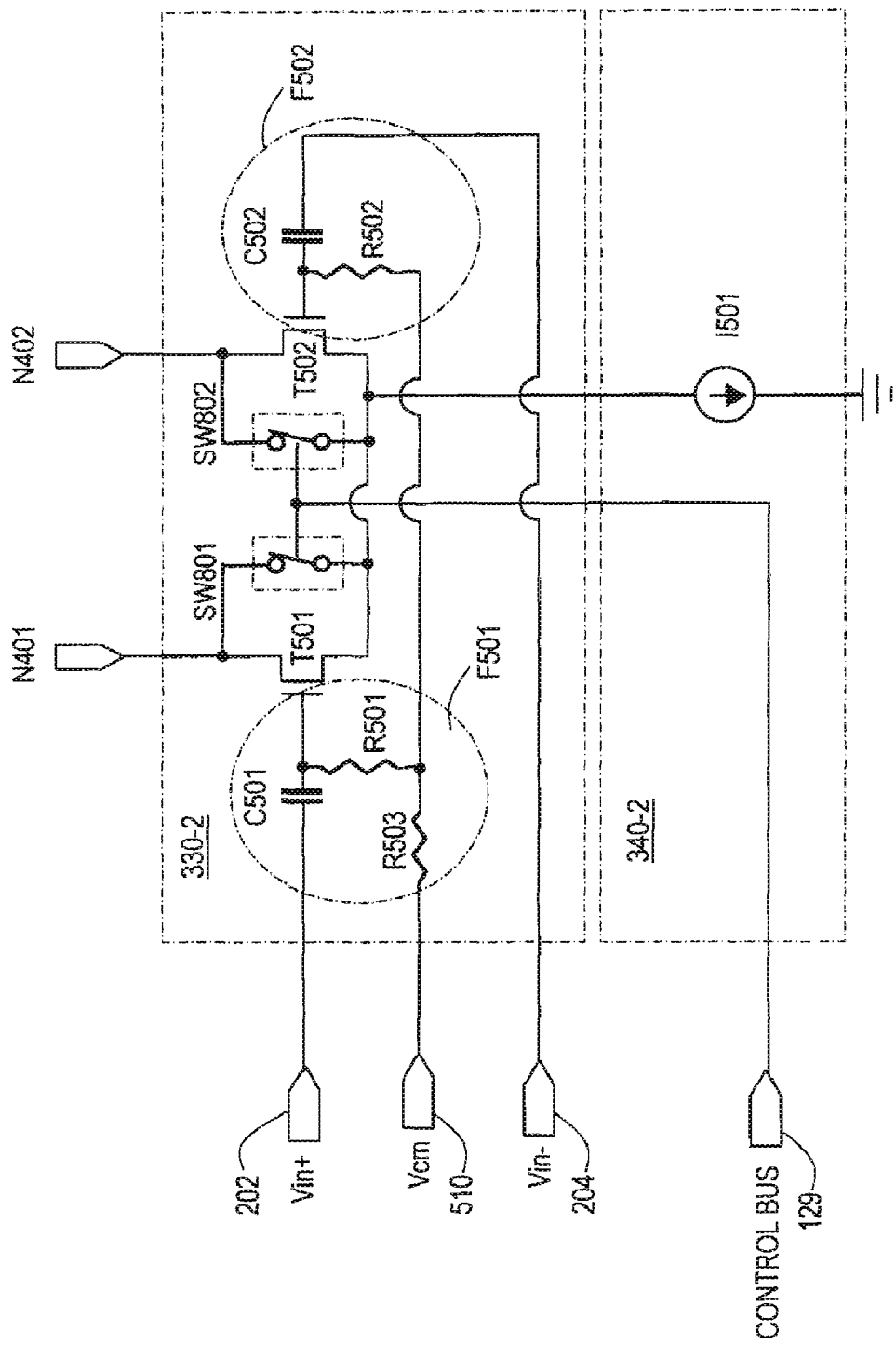
FIG. 8 is a schematic diagram of another exemplary switchable high-frequency gain circuit with a complementary current circuit for use in the first amplifying stage of FIG. 3.

Continuing to FIG. 8, a schematic diagram of another gain circuit 330-2 with complementary current circuit 340-2 for use in the first amplifying stage 210 of FIG. 3 is depicted. As shown in FIG. 8, the overall configuration of gain circuit 330-2 and current source 340-2 is similar to gain circuit 330-1 and current source 340-1 of FIG. 5 except that series switch SW501 of current source 340-1 is replaced with two "shunting" switches SW801 and SW802 respectively placed across the drains and sources of transistors T501 and T502.

In operation, gain circuit 330-2 may be enabled to provide differential current to nodes N401 and N402 when shunting switches SW801 and SW802 are turned off/opened. However, when shunting switches SW801 and SW802 are on/closed, the conductive channels of transistors T501 and T502 are effectively shorted such that, while a constant current may be provided to both nodes N401 and N402, no differential current (and thus no gain) is provided. As with the gain circuit 330-1 and current source 340-1 of FIG. 5, gain circuit 330-2 and current source 340-2 may employ variable components or be replicated such that any or all of gain circuits 330-1 . . . 330-N and respective current source 340-1 . . . 340-N share a similar or identical configuration.

Figure 9:
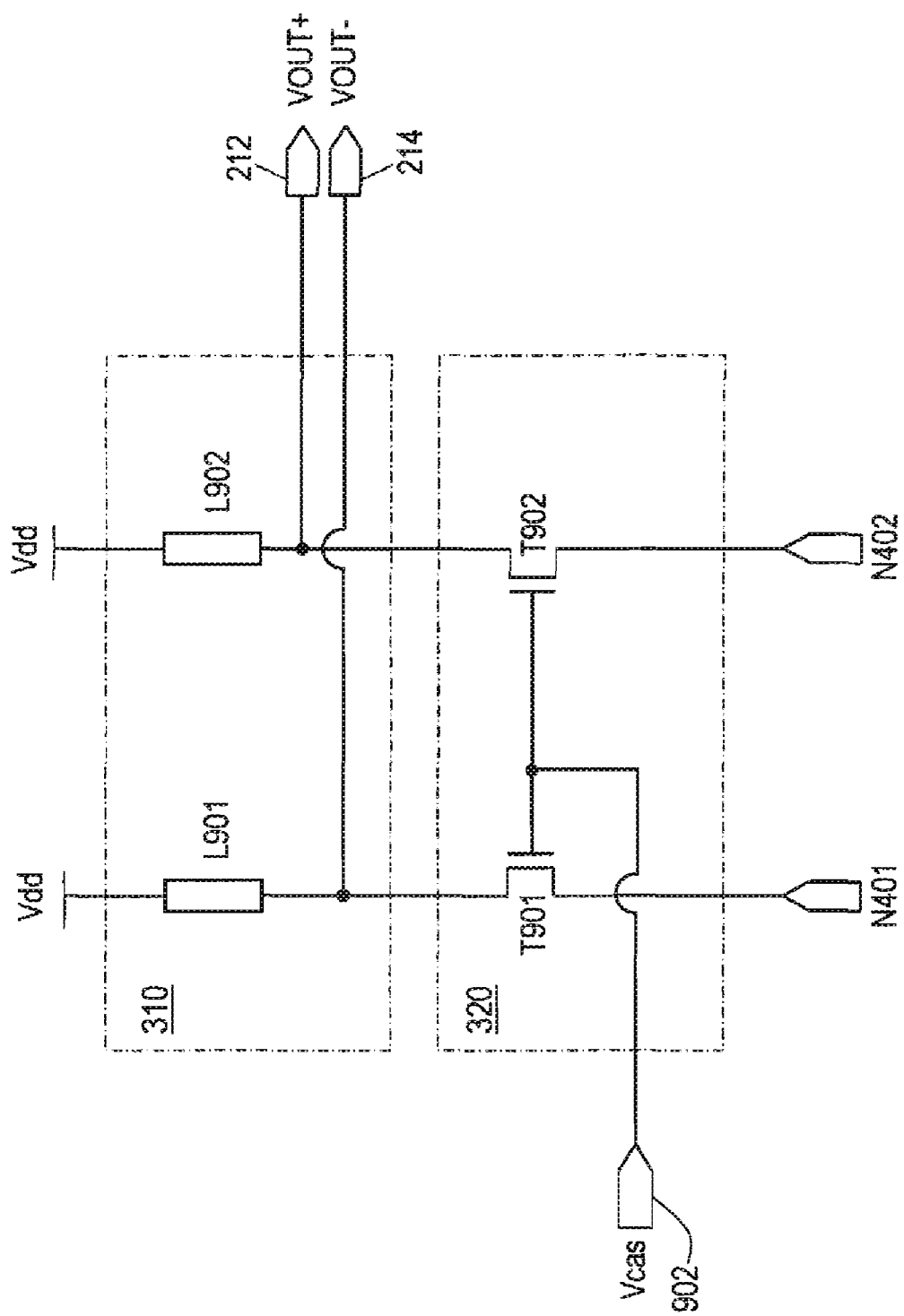
FIG. 9 is a schematic diagram of an exemplary load circuit and cascade circuit for use in the exemplary amplifying stage of FIG. 3.

Continuing to FIG. 9, a schematic diagram of an exemplary load circuit 310 is shown in context with an exemplary cascade circuit 320. Load circuit 310 includes two loads L901 and L902 while the cascade circuit 320 includes a pair of cascade transistors T901 and T902 in series with loads L901 and L902.

In operation, cascade transistors T901 and T902 may be appropriately biased via a cascade biasing node 902. Assuming that cascade transistors T901 and T902 are appropriately biased, the sources of cascade transistors T901 and T902 may receive a combined differential current signal derived from the sum of the individual current drains of gain circuits 330-0 to 330-N. Cascade transistors T901 and T902 may pass the combined current drains of the various gain circuits 330-0 . . . 330-N to loads L901 and L902 while effectively decoupling the parasitic loading inherent in gain circuits 330-0 . . . 330-N as well as provide additional gain. This may allow loads L901 and L902 to better combine the individual current signals of gain circuits 330-0 through 330-N to provide a differential output voltage signal (Vout+, Vout−) at nodes 212 and 214.

Note that while loads L901 and L902 are depicted as generic components, it should be appreciated that loads L901 and L902 may vary from embodiment to embodiment to include any number of resistors, current mirrors or other controlled current sources as may be found necessary or advantageous.

Figure 10:
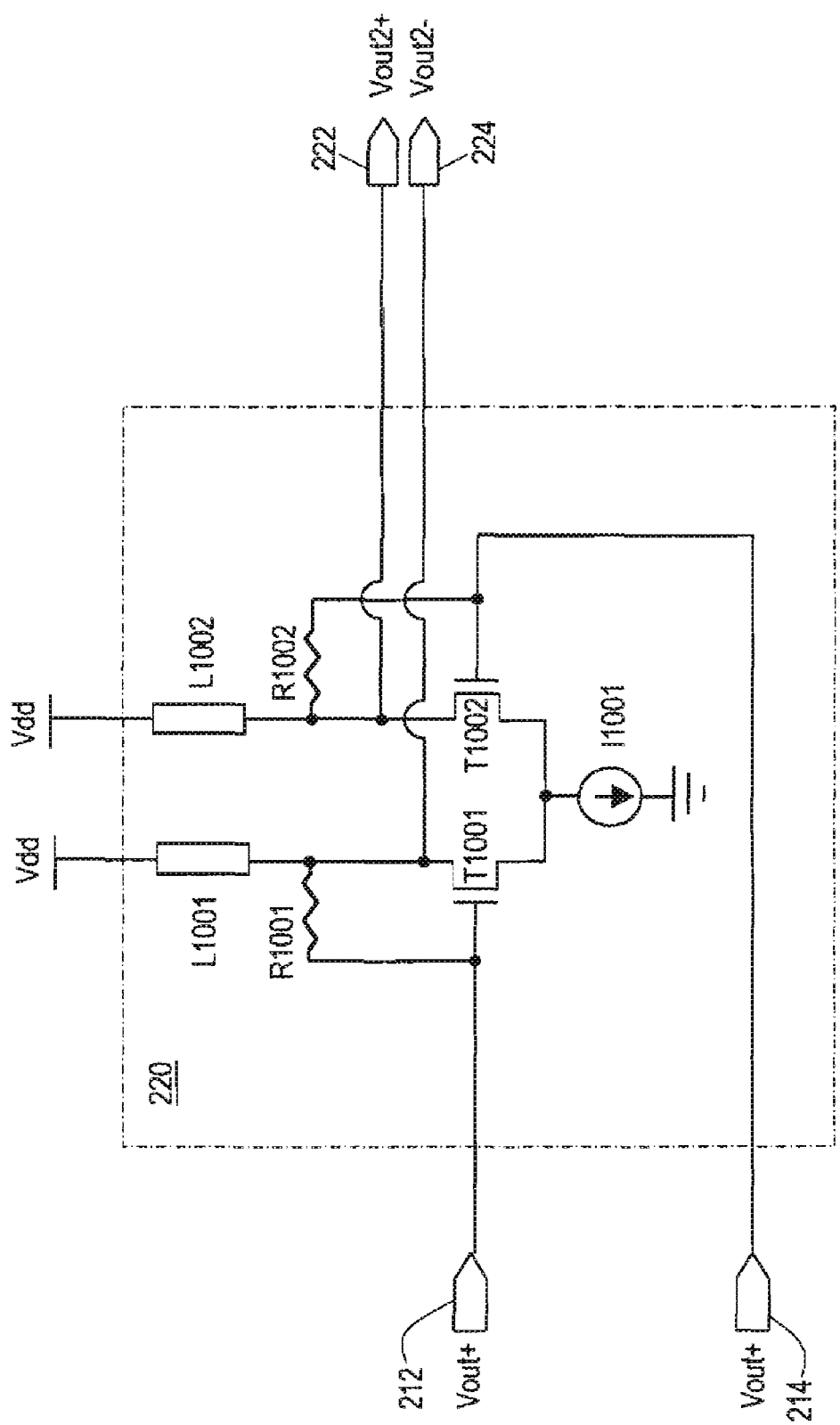
FIG. 10 is a schematic diagram of an exemplary second amplification stage of the amplifier depicted in FIG. 2.

Continuing to FIG. 10, an optional second amplifier stage 220 of FIG. 3 is depicted. As shown in FIG. 10, second amplifier stage 220 may include a differential transistor pair T1001 and T1002 with their sources commonly coupled to current source I1001, and their drains respectively connected to loads L1001 and L1002 and feedback resistors R1001 and R1002.

In operation, transistors T1001 and T1002 may receive differential output signal (Vout+, Vout−) provided from load circuit 310 of FIG. 8 via nodes 212 and 214, amplify the differential signal and provide a further amplified signal (Vout2+, Vout2−) to output nodes 222 and 224. Note that while second amplifier stage 220 may not be necessary for many applications, it should be appreciated that second amplifier stage 220 may be used in many applications where additional gain is required, it is desirable to reduce the output loading on loads L901 and L902, a transconductance amplifier is desired (by removing loads L1001 and L1002) and so on.

Figure 11:
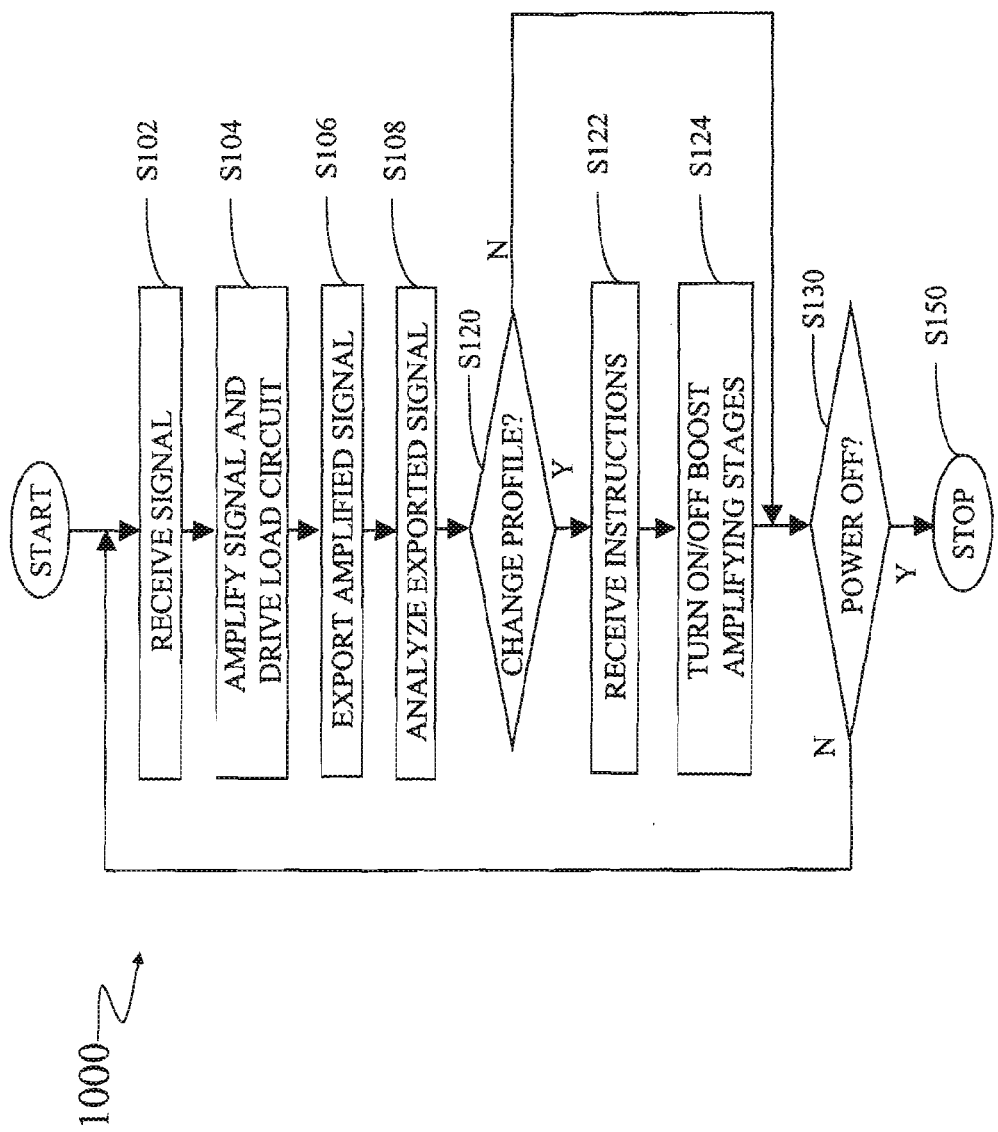
FIG. 11 is a flowchart outlining an exemplary process for operating an amplifier having the capacity to modify the amplifier's gain-frequency profile.

FIG. 11 is a flowchart outlining an exemplary process for operating a programmable amplifier, such as amplifier 124 discussed in the previous figures. The process starts in step S102 where the programmable amplifier receives an analog signal, and the process goes to step S104. In step S104, the received analog signal may be separately amplified by any number of gain circuits, such as "flat" gain circuit 330-0 depicted in FIG. 4 as well as a number of high-frequency boosting gain circuits, such as gain-frequency profile modifying circuit 330-1 depicted in FIG. 5 and/or gain-frequency profile modifying circuit 330-2 depicted in FIG. 8. As the various gain circuits separately amplify the received analog signal, the various amplified signals may be combined to drive a common load circuit where a differential voltage may be produced, and the process goes to step S106. In step S106, the amplified signal may be output to an external device, such as a controller, signal processor or other system that may be capable of analyzing the exported signal, and the process goes to step S108.

In step S108, the output signal may be analyzed to determine whether a resultant gain-frequency profile of the programmable amplifier exhibits the desired characteristics and/or determine whether the received signal of step S102 may be subject to high-frequency attenuation, and the process goes to step S120. In step S120, a determination is made as to whether to reconfigure the programmable amplifier in order to change the gain-frequency profile, e.g., emphasize or de-emphasize high-frequency content, of the output amplified signal of step S106. If the programmable amplifier is to be reconfigured, the process goes to step S122; otherwise, the process jumps to step S130.

In step S122, the programmable amplifier may receive any number of instructions to make the appropriate changes in an existing gain and/or gain-frequency profile. Next, in step S124, an appropriate combination of gain and gain-frequency profile adjusting circuits in the programmable amplifier may be turned on or off consistent with the instructions of step 1022 to create a signal having a modified gain and/or modified gain-frequency profile, and the process goes to step S130.

In step S130, a determination is made as to whether to turn the power of the subject amplifier off. If power is to be turned off, the process goes to step 1050 where the process stops; otherwise, the process returns to step S102.

While the disclosed methods and systems have been described in conjunction with exemplary embodiments, these embodiments should be viewed as illustrative, not limiting. Various modifications, substitutes, or the like are possible within the spirit and scope of the disclosed methods and systems.

What is claimed is:

1. A programmable amplifier that amplifies an electrical signal, comprising:
    a load circuit;
    a first gain circuit coupled to the load circuit, the first gain circuit amplifying the electrical signal based on a first gain-frequency profile, the first gain-frequency profile including a first portion and a second portion which is less than the first portion; and
    one or more second gain circuits connected in parallel with one another and with the first gain circuit, each second gain circuit being programmable to substantially modify the second portion of the first gain-frequency profile without appreciably modifying the first portion of the first gain-frequency profile.

2. The programmable amplifier of claim 1, further comprising:
one or more programming circuits, the programming circuits included in at least one of the second gain circuits; and
one or more control data inputs that are coupled to the at least one of the second gain circuits and that control the programming circuits.

3. The programmable amplifier of claim 2, further comprising:
a first current source that is included in the first gain circuit; and
one or more second current sources included in the second gain circuits.

4. The programmable amplifier of claim 3, further comprising:
one or more first transistors included in the first gain circuit connected to the first current source; and
one or more second transistors included in the second gain circuits connected to the second current sources, wherein each of the first and second transistors includes a control terminal, a first terminal and a second terminal.

5. The programmable amplifier of claim 4, wherein the first transistors comprise two transistors connected as a differential pair, control terminals of the two transistors receiving the electrical signal, first terminals of each of the two transistors being connected together and coupled to the first current source, and second terminals of each of the two transistors being coupled to the load circuit.

6. The programmable amplifier of claim 5, wherein the first transistors are MOSFET transistors, the control terminals are gate terminals, the first terminals are sources and the second terminals are drains.

7. The programmable amplifier of claim 4, wherein the second transistors comprise one or more differential pairs, each of the differential pairs including two transistors, control terminals of the two transistors being coupled to the electrical signal, first terminals of each of the two transistors being connected together and coupled to one of the second current sources and second terminals of each of the two transistors being coupled to second terminals of the first transistors.

8. The programmable amplifier of claim 7, wherein the second transistors are MOSFET transistors, the control terminals are gate terminals, the first terminals are sources and the second terminals are drains.

9. The programmable amplifier of claim 4, wherein the programming circuits include one or more switches being controlled by one or more signals received from the control data inputs, the switches turning on or off based on the signals.

10. The programmable amplifier of claim 9, wherein each of the switches is connected to one of the second current sources to connect or disconnect the second current sources to or from the second transistors.

11. The programmable amplifier of claim 9, wherein each of the switches is connected across the first and second terminals of the second transistors, the switches shunting or not shunting the second transistors.

12. The programmable amplifier of claim 9, wherein the switches include one or more transistors.

13. The programmable amplifier of claim 1, further comprising:

a cascade circuit, the first gain circuit coupled to the load circuit through the cascade circuit; and
a cascade stage bias circuit biasing the cascade circuit.

14. The programmable amplifier of claim 1, further comprising:
a second amplifier stage that inputs output signals generated at the load circuit, further amplifies the output signals and outputs the further amplified output signals.

15. The programmable amplifier of claim 1, wherein the load circuit comprises one or more of:
a resistive element; and
a current source.

16. The programmable amplifier of claim 1, further comprising:
one or more capacitive coupling networks coupling the second gain circuits to the electrical signal; and
one or more biasing terminals, the biasing terminals connected to the capacitive coupling networks.

17. The programmable amplifier of claim 16, further comprising:
one or more capacitive elements and one or more resistive elements included in the capacitive coupling networks, the capacitive elements and resistive elements performing filtering characterized by one or more poles and/or zeros.

18. The programmable amplifier of claim 17, wherein the capacitive coupling networks performing one or more of:
high-pass filtering; and
band-pass filtering.

19. The programmable amplifier of claim 18, wherein the high-pass and/or band-pass filtering is obtained by one of selecting fixed values of the capacitive elements and resistive elements or by varying the values of the capacitive elements or resistive elements or a combination thereof, if varying the values of either the capacitive elements and/or resistive elements, the values being varied based on a control data.

20. The programmable amplifier of claim 17, wherein each of the second gain circuits includes one capacitive coupling network and amplifies the electrical signal based on a second gain-frequency profile, the second gain-frequency profile combines with the first gain-frequency profile to generate a composite gain-frequency profile for the programmable amplifier.

21. The programmable amplifier of claim 20, wherein the composite gain-frequency profile is changed by a control data by controlling the second gain circuits.

22. A programmable amplifier that amplifies an electrical signal, comprising:
a load circuit;
a first gain circuit coupled to the load circuit, the first gain circuit including a first pair of transistors connected as a first differential pair and connected to a first current source, the first gain circuit amplifying the electrical signal based on a first gain-frequency profile;
one or more second gain circuits connected in parallel with one another and with the first gain circuit, each of the second gain circuits including a second pair of transistors connected as a second differential pair and connected to a second current source, wherein each of the transistors of the first and second pairs includes a control terminal, a first terminal and a second terminal, each of the second gain circuits amplifying the electrical signal based on a second gain-frequency profile;
one or more programming circuits connected to at least one of the second gain circuits and controlled by one or more control data inputs to turn on and off one or more of the second gain circuits; and one or more capacitive coupling networks coupling the second gain circuits to the electrical signal, the capacitive networks including one or more capacitive elements and one or more resistive elements that perform filtering, each of the second gain circuits in combination with a corresponding capacitive coupling network amplifying the electrical signal based on a second gain-frequency profile, one or more of the second gain-frequency profiles combining with the first gain-frequency profile to generate a composite gain-frequency profile for the programmable amplifier, the composite gain-frequency profile being changed by the control data inputs via the programming circuits.

23. The programmable amplifier of claim 22, wherein at least one of the second gain circuits is coupled to a current switching circuit.

24. The programmable amplifier of claim 23, wherein each of the second gain circuits includes a filtering circuit for filtering the electrical signal before the second gain circuit receives the electrical signal.

25. A communications system incorporating the programmable amplifier of claim 22.

26. A data storage system incorporating the programmable amplifier of claim 22.

27. A method for programmably amplifying an electrical signal, comprising:
  amplifying the electrical signal to generate a first amplified signal based on a first gain-frequency profile, the first gain-frequency profile including a first portion and a second portion which is less than the first portion;
  amplifying the electrical signal to generate one or more second amplified signals based on one or more second gain-frequency profiles; and
  outputting an output amplified signal based on a composite gain-frequency profile that is a combination of the first gain-frequency profile and the second gain-frequency profiles, and the composite gain-frequency profile substantially modifying the second portion of the first gain-frequency profile without appreciably modifying the first portion of the first gain-frequency profile.

28. The method of claim 27, further comprising:
  generating the second gain-frequency profiles by filtering the electrical signal;
  selecting one or more of the second gain-frequency profiles based on one or more control data inputs; and
  combining the first gain-frequency profile and the selected second gain-frequency profiles to form the composite gain-frequency profile.

29. The method of claim 27, wherein the amplifying the electrical signal to generate one or more second amplified signals comprises:
  receiving the electrical signal through one or more capacitive networks;
  selectively amplifying one or more outputs of the capacitive networks to generate the second amplified signals; and
  adding the second amplified signals with the first amplified signal to generate the output amplified signal.

30. The method of claim 29, further comprising:
  changing the composite gain-frequency profile by amplifying selected outputs of capacitive networks based on control data inputs.

31. A method of forming a programmable amplifier for amplifying an electrical signal, comprising:
  connecting one or more first transistors with a first current source to form a first gain circuit amplifying the electrical signal based on a first gain-frequency profile, and the first gain-frequency profile including a first portion and a second portion which is less than the first portion;
  connecting one or more second transistors with one or more corresponding second current sources to form one or more second gain circuits;
  connecting in parallel the first and second gain circuits; and
  programming the second gain circuits to modify the second portion of the first gain-frequency profile of the first gain circuit without appreciably modifying the first portion of the first gain-frequency profile.

32. The method of claim 31, further comprising:
  connecting one or more programming circuits to either the second transistors or the corresponding second current sources; and
  connecting the programming circuits to one or more control data inputs.

33. The method of claim 31, further comprising:
  connecting a first differential pair of transistors with the first current source to form the first gain circuit;
  connecting one or more second differential pairs of transistors with the corresponding second current sources to form the second gain circuits; and
  connecting control terminals of the first and second differential pairs of transistors to the electrical signal.

34. The method of claim 33, further comprising:
  connecting one or more capacitive coupling networks between the electrical signal and the control terminals of the second differential pairs of transistors; and
  connecting a common terminal to the capacitive coupling networks.

35. The method of claim 33, further comprising:
  connecting first terminals of the first differential pair of transistors and the second differential pairs of transistors together; and
  coupling a load circuit to the first terminals of the first and second differential pairs of transistors.

36. The method of claim 35, further comprising:
  connecting a cascade circuit between the first terminals of the first and second differential pairs of transistors and the load circuit; and
  connecting a biasing circuit to the cascade circuit.

37. The method of claim 35, further comprising:
  connecting one or more second amplifier stages to outputs of the load circuit; and
  outputting an output of the one or more second amplifier stages as outputs of the programmable amplifier.

38. A programmable amplifier that amplifies an electrical signal, comprising:
  first gain means for amplifying the electrical signal based on a first gain-frequency profile, and the first gain-frequency profile including a first portion and a second portion which is less than the first portion; and
  one or more second gain means for substantially modifying the second portion of the first gain-frequency profile without appreciably modifying the first portion of the first gain-frequency profile.

39. The programmable amplifier of claim 38, further comprising:
  programming means for selecting one or more of the second gain means; and
  control means for controlling the programming means based on a control data input.

40. The programmable amplifier of claim 38, further comprising:
  filtering means for coupling the electrical signal to the second gain means; and
  common voltage means for biasing the filtering means.

41. The programmable amplifier of claim 38, further comprising:
cascade means for connecting the first and second gain means to a load means; and
cascade biasing means for biasing the cascade means.

42. The programmable amplifier of claim 41, further comprising:

one or more second amplifier stage means for amplifying output of the load means; and
output means for outputting an output of the second amplifier stage means as an output of the programmable amplifier.

* * * * *